(12) United States Patent
Howell et al.

(10) Patent No.: US 6,561,818 B1
(45) Date of Patent: May 13, 2003

(54) ELECTRICAL CONNECTOR WITH METAL RETENTION ARMS

(75) Inventors: David Gregory Howell, Gilbert, AZ (US); Ming-Lun Szu, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/222,126

(22) Filed: Aug. 15, 2002

(51) Int. Cl.[7] .............................................. H01R 12/00
(52) U.S. Cl. ....................................................... 439/66
(58) Field of Search ................................... 439/66, 71

(56) References Cited

U.S. PATENT DOCUMENTS

| | | | |
|---|---|---|---|
| 6,146,152 A | * | 11/2000 | McHugh et al. ............... 439/66 |
| 6,164,978 A | * | 12/2000 | McHugh et al. ............... 439/66 |
| 6,179,624 B1 | * | 1/2001 | McHugh et al. ............... 439/71 |
| 6,186,797 B1 | * | 2/2001 | Wang et al. .................... 439/66 |
| 6,203,331 B1 | * | 3/2001 | McHugh et al. ............... 439/71 |
| 2002/0055283 A1 | * | 5/2002 | Yoon et al. ..................... 439/66 |

* cited by examiner

Primary Examiner—Tho D. Ta
Assistant Examiner—Ann McCamey
(74) Attorney, Agent, or Firm—Wei Te Chung

(57) ABSTRACT

An electrical connector for connecting an electronic package (1) with a circuit substrate. A preferred embodiment of the electrical connector is a land grid array connector, which includes a parallelepiped-shaped insulative housing (2) and a plurality of retention arms (3). The housing includes four raised sides (21), and the retention arms are located in two contiguous raised sides. The retention arms include engaging portions (32) for resiliently abutting side walls of the electronic package. A material of the retention arms is different from a material of the housing. In the preferred embodiment, the material of the retention arms is metal. Thus the retention arms have superior resiliency, especially compared to the material of the housing.

5 Claims, 2 Drawing Sheets

ELECTRICAL CONNECTOR WITH METAL RETENTION ARMS

BACKGROUND OF THE INVENTION

1. Field of the Invention

The present invention relates to an electrical connector for electrically connecting an electronic package such as a central processing unit (CPU) with a circuit substrate such as a printed circuit board (PCB), and particularly to a land grid array connector with metal retention arms for stabilizing the CPU.

2. Description of Prior Art

Land grid array (LGA) connectors are commonly used with electronic packages such as CPUs. An LGA connector does not require soldering when it is engaged with an associated printed circuit board (PCB). Normally, an LGA assembly includes an electronic package having a plurality of flat contact pads formed on a bottom surface thereof, a connector having an insulative housing and defining a plurality of passageways arranged in a rectangular array, and a plurality of conductive contacts received in the passageways of the connector for electrically connecting with the electronic package.

In keeping with the trend toward miniaturization in computer technology, LGA connectors have become smaller and smaller while the density of the array of contacts has become higher and higher. In light of this, it is essential to accurately align and then fix the electronic package to the LGA connector to ensure correct electrical connection and reliable signal transmission therebetween. Several means have been devised to this end, and are disclosed in U.S. Pat. Nos. 6,146,152, 6,186,797, 6,164,978, 6,203,331 and 6,179,624.

Referring to FIG. 3, U.S. Pat. No. 6,146,152 discloses an LGA connector comprising an insulative housing 6 defining a plurality of passageways 60 therein for receiving LGA contacts 5. The housing 6 is substantially a parallelepiped having four raised sides 61 cooperatively defining a central cavity 63 therebetween. The central cavity 63 is sized to receive an external electrical device such as a CPU package 7 therein. A multiplicity of passageways 60 is defined in a main body of the housing 6, below and in communication with the central cavity 63. A multiplicity of LGA contacts 5 is received in the passageways 60 respectively. A first resilient arm 611 is formed in one of the four raised sides 61, and can deform into a first space 610 defined in said raised side 61. Two second resilient arms 612 are formed in another raised side 61 that is adjacent said one of the four raised sides 61. The second resilient arms 612 can deform into respective second spaces 620 defined in said other raised side 61. The first resilient arm 611 and the second resilient arms 612 each have a chamfered surface 611A, 612A respectively formed in an upper portion thereof, for cooperatively guiding insertion of the CPU package 7 into the central cavity 63. Thus the CPU package 7 can be fixed in the central cavity 63 by normal force arising from the deformation of the resilient arms 611, 612.

A recessed bottom surface of the housing 6 at the central cavity 63 must be coplanar to ensure accurate receipt of the CPU package 7. The housing 6 is typically made by injection molding. Thus a material of the housing 6 needs to be both insulative and able to flow freely during the molding process. Generally, such material has poor elastic strength and resilient deformation capability. The resilient arms 611, 612 are integrally formed with the housing 6, therefore the resilient arms 611, 612 generally have poor elastic strength and resilient properties. Occasionally, undesired shock and vibration sustained by the CPU package 7 causes the resilient arms 611, 612 to deform improperly or even break. When this happens, the CPU package 7 may become displaced in the central cavity 63. This can result in failure of signal transmission between the CPU package 7 and the LGA connector.

Hence, an new LGA connector that overcomes the above-mentioned difficulties is desired.

SUMMARY OF THE INVENTION

Accordingly, an object of the present invention is to provide an electrical connector for electrically connecting an electronic package with a circuit substrate such as a PCB, the electrical connector having resilient retention arms that resist improper deformation and damage.

To achieve the above-mentioned object, an electrical connector for connecting an electronic package with a circuit substrate is provided by the present invention. In a preferred embodiment, the electrical connector is an LGA connector, and includes a parallelepiped-shaped insulative housing and a plurality of retention arms. The housing includes four raised sides, and the retention arms are located in two contiguous raised sides. The retention arms include engaging portions for resiliently abutting side walls of the electronic package. A material of the retention arms is different from a material of the housing. In the preferred embodiment, the material of the retention arms is metal. Thus the retention arms have superior resiliency, especially compared to the material of the housing.

Other objects, advantages and novel features of the invention will become more apparent from the following detailed description when taken in conjunction with the accompanying drawings, in which:

DETAILED DESCRIPTION OF PREFERRED EMBODIMENT OF THE INVENTION

Reference will now be made to the drawings to describe the present invention in detail.

Figure 1:
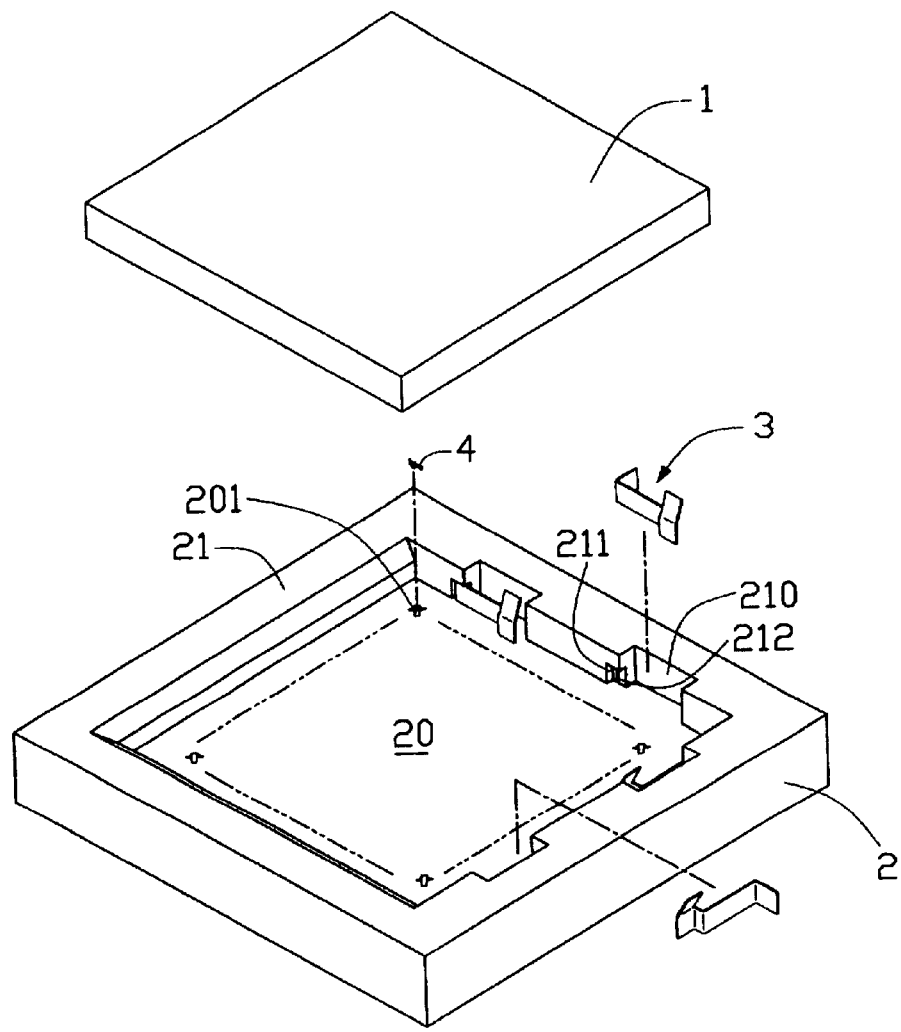
FIG. 1 is a simplified, exploded isometric view of an LGA connector in accordance with a preferred embodiment of the present invention, together with a CPU package.
Figure 2:
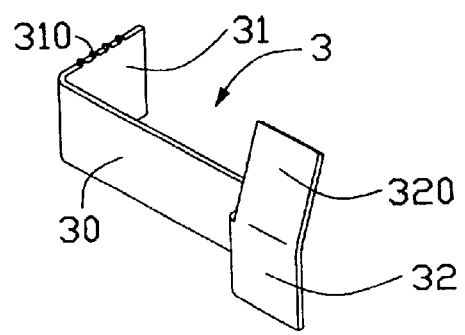
FIG. 2 is an enlarged isometric view of a retention arm of the LGA connector of FIG. 1.
Figure 3:
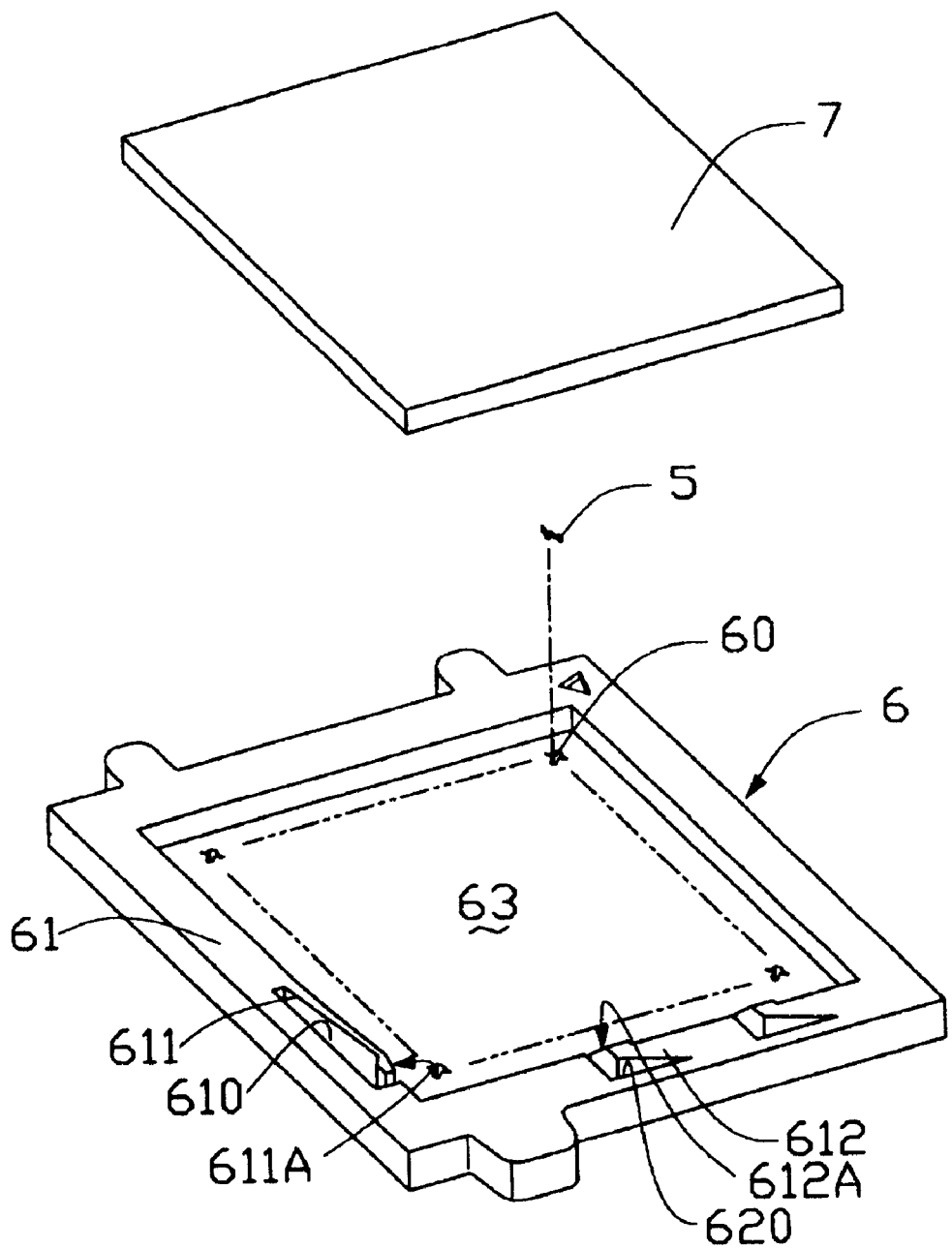
FIG. 3 is a simplified, exploded isometric view of a conventional LGA connector, together with a CPU package.

Referring to FIGS. 1 and 2, an LGA connector in accordance with a preferred embodiment of the present invention comprises an insulative housing 2. The housing 2 is substantially a parallelepiped having four raised sides 21 cooperatively defining a central cavity 20 therebetween. The central cavity 20 is sized to receive an external electrical device such as a CPU package 1 therein. A multiplicity of passageways 201 is defined in a main body of the housing 2, below and in communication with the central cavity 20. A multiplicity of LGA terminals 4 is interferentially received in the passageways 201 respectively. Two spaced receiving cavities 210 are defined in each of two contiguous raised sides 21 of the four raised sides 21. Each receiving cavity 210 is in communication with cavity 20. A locating recess 211 is defined adjacent and in communication with each receiving cavity 210. A slot 212 is defined adjacent and in communication with each locating recess 211.

Two retention arms 3 are located in each of the two contiguous raised sides 21 of the four raised sides 21. Each retention arm 3 is stamped from a metal sheet, and comprises a resilient beam 30, an engaging portion 32 extending from one end of the resilient beam 30 for abutting against a corresponding side wall of the CPU package 1, and a retention portion 31 perpendicularly extending from an opposite end of the resilient beam 30 for being received in a corresponding slot 212. A slanted guiding portion 320 extends upwardly and outwardly from a top of the engaging portion 32, to facilitate insertion of the CPU package 1 into the central cavity 20. A plurality of barbs 310 is formed on the retention portion 31, for interferentially engaging in the corresponding slot 212.

In assembly, the retention portions 31 of the retention arms 3 are pressed into the slots 212 and accommodated in the locating recesses 211 of the raised sides 21. The resilient beams 30 are aligned with the respective raised sides 21, and can deflect deeper into the receiving cavities 210 of the raised sides 21. The engaging portions 32 are located just inside the central cavity 20, with the guiding portions 320 substantially aligned with the respective raised sides 21. When the CPU package 1 is pressed onto the LGA connector, the guiding portions 320 guiding insertion of the CPU package 1 into the central cavity 20, and two contiguous side edges of the CPU package 1 deflect the guiding portions 320 into the receiving cavities 210. The engaging portions 32 resiliently abut against said side edges of the CPU package 1. Thus the CPU package 1 is securely fixed in the central cavity 20 by normal force arising from the resilient deformation of the retention arms 3.

Because each retention arm 3 is made from metal, the retention arm 3 has superior resiliency, especially compared to a material of the housing 2. The retention arm 3 has a correspondingly long cycle lifetime. Risk of improper deformation or damage to the retention arm 3 is minimized.

While a preferred embodiment in accordance with the present invention has been shown and described, equivalent modifications and changes known to persons skilled in the art according to the spirit of the present invention are considered within the scope of the present invention as defined in the appended claims.

What is claimed is:

1. An electrical connector comprising:
   a rectangular type socket defining a periphery upstanding wall with therein a central cavity exposed to an exterior on a top face thereof;
   a plurality of contacts disposed in the housing under the cavity with top portions extending upwardly into the cavity;
   two adjacent sides of said wall defining two side cavities, respectively, directly communicatively facing said central cavity;
   a locating section positioned around each of said side cavities;
   a metal retention arm generally located in each of said side cavities and essentially discrete from the housing, the metal retention arm made from sheet metal and including a mounting portion secured to the locating section, a resilient beam extending horizontally from said mounting portion generally along the corresponding side of the peripheral wall, and an engaging portion extending from the resilient beam opposite to said mounting portion and invading the central cavity; wherein
   most portions of said retention arm generally defines an equal thickness thereof.

2. The connector as claimed in claim 1, wherein the retention arms in said two side cavities, respectively, are arranged diagonally symmetric with each other.

3. The connector as claimed in claim 1, said side cavities do not extend through the housing in a vertical direction.

4. The connector as claimed in claim 1, wherein a guiding portion integrally extends obliquely upwardly from the corresponding engaging portion.

5. The connector as claimed in claim 1, wherein said guiding portion extends from an upper edge of said engaging portion.

* * * * *